US011487200B2

(12) United States Patent
Lee et al.

(10) Patent No.: US 11,487,200 B2
(45) Date of Patent: Nov. 1, 2022

(54) POSITIVE-TYPE PHOTOSENSITIVE RESIN COMPOSITION AND CURED FILM PREPARED THEREFROM

(71) Applicant: ROHM AND HAAS ELECTRONIC MATERIALS KOREA LTD, Chungcheongnam-do (KR)

(72) Inventors: Jung-Hwa Lee, Gyeonggi-do (KR); Geun Huh, Gyeonggi-do (KR); Ju-Young Jung, Gyeonggi-do (KR); Yeonok Kim, Gyeonggi-do (KR)

(73) Assignee: Rohm and Haas Electronic Materials Korea Ltd.

( * ) Notice: Subject to any disclaimer, the term of this patent is extended or adjusted under 35 U.S.C. 154(b) by 593 days.

(21) Appl. No.: 16/402,284

(22) Filed: May 3, 2019

(65) Prior Publication Data
US 2019/0369493 A1 Dec. 5, 2019

(30) Foreign Application Priority Data
May 30, 2018 (KR) .......................... 10-2018-0061690

(51) Int. Cl.
| G03F 7/004 | (2006.01) |
| G03F 7/022 | (2006.01) |
| G03F 7/38 | (2006.01) |
| G03F 7/20 | (2006.01) |
| C08K 5/13 | (2006.01) |
| C08L 33/08 | (2006.01) |
| C08L 33/10 | (2006.01) |
| C08L 83/04 | (2006.01) |

(52) U.S. Cl.
CPC .......... *G03F 7/0226* (2013.01); *G03F 7/2002* (2013.01); *G03F 7/38* (2013.01); *C08K 5/13* (2013.01); *C08L 33/08* (2013.01); *C08L 33/10* (2013.01); *C08L 83/04* (2013.01)

(58) Field of Classification Search
CPC ...................................................... G03F 7/0226
See application file for complete search history.

(56) References Cited

U.S. PATENT DOCUMENTS

| 8,486,604 | B2 * | 7/2013 | Hanamura ................ G03F 7/40 |
| | | | 430/191 |
| 10,606,173 | B2 * | 3/2020 | Takahashi ................ G03F 7/20 |
| 2011/0097835 | A1 * | 4/2011 | Park .................... H01L 27/1288 |
| | | | 438/34 |
| 2012/0237873 | A1 * | 9/2012 | Fujiwara .............. C09D 183/06 |
| | | | 430/280.1 |

(Continued)

FOREIGN PATENT DOCUMENTS

| JP | 2011090163 A | * | 5/2011 |
| JP | 5099140 B2 | | 12/2012 |

*Primary Examiner* — Amanda C. Walke
(74) *Attorney, Agent, or Firm* — G. Creston Campbell

(57) ABSTRACT

The present invention relates to a positive-type photosensitive resin composition and a cured film prepared therefrom. The positive-type photosensitive resin composition comprises an acrylic copolymer having a dissolution rate to a developer in a specific range and a compound containing a phenolic hydroxyl group, so that it is possible to attain a high contrast and a high sensitivity pattern when a cured film is formed. Further, it is possible to further enhance the adhesiveness of a pattern when a half-tone, as well as a full-tone, is formed.

11 Claims, 2 Drawing Sheets

(56) References Cited

U.S. PATENT DOCUMENTS

2015/0031808 A1* 1/2015 Huang .................. G03F 7/0233
                                                524/159
2016/0161847 A1* 6/2016 Araki ...................... G06F 3/041
                                                430/7
2017/0038681 A1* 2/2017 Shindo ................. C08K 5/3492

* cited by examiner

| | Example | | Comp. Example |
|---|---|---|---|
| 1 |  | 1 |  |
| 2 |  | 2 |  |
| 3 |  | 3 |  |
| 4 |  | 4 |  |
| 5 |  | 5 |  |
| 6 |  | | |

POSITIVE-TYPE PHOTOSENSITIVE RESIN COMPOSITION AND CURED FILM PREPARED THEREFROM

TECHNICAL FIELD

The present invention relates to a photosensitive resin composition and a cured film prepared therefrom. More specifically, the present invention relates to a positive-type photosensitive resin composition that has a high contrast and is excellent in the formation of a high sensitivity pattern and the adhesion in a half-tone region, and a cured film prepared therefrom to be used in a liquid crystal display, an organic EL display, and the like.

BACKGROUND ART OF THE INVENTION

Generally, a transparent planarization film is formed on a thin film transistor (TFT) substrate for the purpose of insulation to prevent a contact between a transparent electrode and a data line in a liquid crystal display or an organic EL display. Through a transparent pixel electrode positioned near the data line, the aperture ratio of a panel may be increased, and high luminance/contrast may be attained. In order to form such a transparent planarization film, several processing steps are employed to impart a specific pattern profile, and a positive-type photosensitive resin composition is widely employed in this process since fewer processing steps are required.

A conventional positive-type photosensitive composition using an acrylic resin as a raw material has a problem that the photosensitive characteristics are deteriorated due to its low contrast (or resolution). It also has disadvantages in that the chemical bonding with a lower substrate is weak, resulting in poor adhesiveness, and that the film retention rate is low.

On the other hand, a positive-type photosensitive composition using a siloxane resin as a raw material is excellent in sensitivity and film retention rate by virtue of its high contrast characteristics. It is also excellent in adhesiveness as compared with an acrylic resin since the silanol group in the siloxane resin can form a chemical bond with the hydroxyl group of a lower substrate.

Thus, a positive-type photosensitive resin composition in which an acrylic resin and a siloxane polymer are employed together to enhance the sensitivity, bonding, and adhesiveness thereof has been used (see Japanese Patent No. 5,099,140).

Meanwhile, if a positive-type photosensitive resin composition comprises a siloxane resin in a certain amount or more, there arises a problem in the process reliability in terms of chemical resistance in a subsequent process of a cured film. Thus, it is important to mix a siloxane resin and an acrylic resin in certain amounts.

However, even if an acrylic resin and a siloxane resin are used together, the problems relating to adhesiveness are not yet resolved. In particular, when a pattern is to be formed in a half-tone region, the half-tone is exposed to a certain transmittance even in a non-exposure region unlike a full-tone, so that dissolution takes place in the entire region in addition to the exposed region. In addition, since a half-tone region has a relatively small thickness as compared with a full-tone region, the adhesiveness of the pattern to a substrate is more problematic in this respect.

PRIOR ART DOCUMENT

Patent Document (Patent Document 1) Japanese Patent No. 5,099,140

DISCLOSURE OF THE INVENTION

Problem to be Solved

Accordingly, in order to solve the above-mentioned problems, the present invention aims to provide a photosensitive resin composition that comprises an acrylic copolymer and a siloxane copolymer in appropriate amounts in which the acrylic copolymer that has an appropriate dissolution rate at the time of development further enhances the sensitivity and the adhesiveness of a pattern to a substrate when a half-tone and a full-tone are formed.

Further, a compound containing a phenolic hydroxyl group is used together, which aims to lower the dissolution rate of an unexposed region to a developer by increasing the binding force with a compound that is activated by light. On the other hand, it aims to further increase the dissolution rate of an exposed region, to thereby enhance the contrast and adhesiveness.

Solution to the Problem

In order to accomplish the above object, the present invention provides a positive-type photosensitive resin composition, which comprises (A) an acrylic copolymer; (B) a siloxane copolymer; (C) a compound containing a phenolic hydroxyl group; and (D) 1,2-quinonediazide compound.

In order to accomplish another object, the present invention provides a cured film prepared from the positive-type photosensitive resin composition.

Advantageous Effects of the Invention

The positive-type photosensitive resin composition of the present invention comprises an acrylic copolymer that has a dissolution rate to a developer in a specific range and a compound containing a phenolic hydroxyl group, so that it is possible to attain a high contrast and a high sensitivity pattern when a cured film is formed. Further, it is possible to further enhance the adhesiveness of a pattern when a half-tone, as well as a full-tone, is formed.

DETAILED DESCRIPTION FOR CARRYING OUT THE INVENTION

Figure 1:
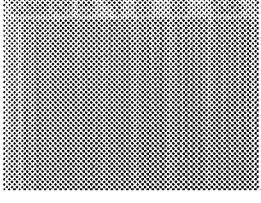
FIG. 1 is microscopic photographs, each of which shows a side of a substrate on which a pattern is formed in order to evaluate the adhesiveness of the pattern to a substrate when a half-tone is formed on a cured film obtained from the compositions. Here, the half-tone is formed from each of the compositions of the Examples and Comparative Examples and is subjected to the subsequent process.
Figure 1:
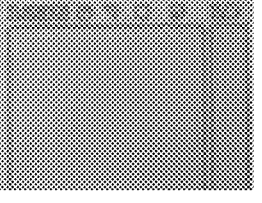
Figure 1:
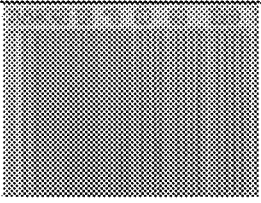
Figure 1:
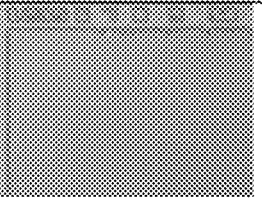
Figure 1:
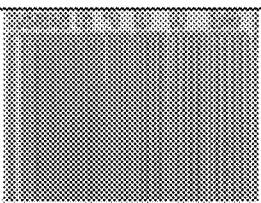
Figure 1:
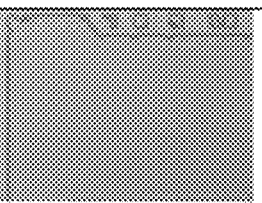
Figure 1:
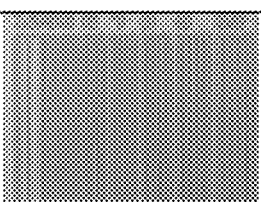
Figure 1:
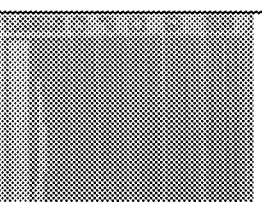
Figure 1:
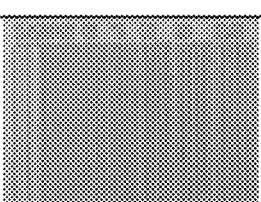
Figure 1:
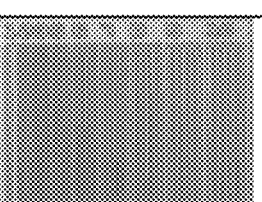
Figure 1:
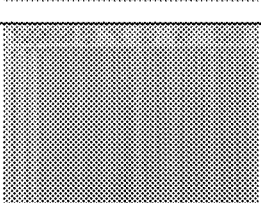

The positive-type photosensitive resin composition of the present invention comprises (A) an acrylic copolymer; (B) a siloxane copolymer; (C) a compound containing a phenolic hydroxyl group; and (D) 1,2-quinonediazide compound. It may optionally further comprise (E) an epoxy compound; (F) a silane compound; (G) a solvent; (H) a surfactant; and/or (I) an adhesion supplement.

Hereinafter, each component of the photosensitive resin composition will be explained in detail.

As used herein, the term "(meth)acryl" refers to "acryl" and/or "methacryl," and the term "(meth)acrylate" refers to "acrylate" and/or "methacrylate."

The weight average molecular weight of each component as described below is measured by gel permeation chromatography (GPC, eluent: tetrahydrofuran) referenced to a polystyrene standard.

(A) Acrylic Copolymer

The positive-type photosensitive resin composition according to the present invention may comprise an acrylic copolymer (A).

The acrylic copolymer (A) may comprise (a-1) a structural unit derived from an ethylenically unsaturated carboxylic acid, an ethylenically unsaturated carboxylic anhydride, or a combination thereof; (a-2) a structural unit derived from an unsaturated compound containing an epoxy group; and (a-3) a structural unit derived from an ethylenically unsaturated compound different from the structural units (a-1) and (a-2).

The acrylic copolymer (A) is an alkali-soluble resin for materializing developability in the development step and also plays the role of a base for forming a film upon coating and a structure for forming a final pattern.

(a-1) Structural Unit Derived from an Ethylenically Unsaturated Carboxylic Acid, an Ethylenically Unsaturated Carboxylic Anhydride, or a Combination Thereof The structural unit (a-1) is derived from an ethylenically unsaturated carboxylic acid, an ethylenically unsaturated carboxylic anhydride, or a combination thereof. The ethylenically unsaturated carboxylic acid, the ethylenically unsaturated carboxylic anhydride, or a combination thereof is a polymerizable unsaturated compound containing at least one carboxyl group in the molecule. It may be at least one selected from an unsaturated monocarboxylic acid such as (meth)acrylic acid, crotonic acid, α-chloroacrylic acid, and cinnamic acid; an unsaturated dicarboxylic acid and an anhydride thereof such as maleic acid, maleic anhydride, fumaric acid, itaconic acid, itaconic anhydride, citraconic acid, citraconic anhydride, and mesaconic acid; an unsaturated polycarboxylic acid having three or more valences and an anhydride thereof; and a mono[(meth)acryloyloxyalkyl] ester of a polycarboxylic acid of divalence or more such as mono[2-(meth)acryloyloxyethyl] succinate, mono[2-(meth)acryloyloxyethyl] phthalate, and the like. But it is not limited thereto. (Meth)acrylic acid among the above is preferable from the viewpoint of developability.

The amount of the structural unit (a-1) may be 5 to 50% by mole, preferably 10 to 40% by mole, based on the total moles of the structural units constituting the acrylic copolymer (A). Within the above range, it is possible to attain a pattern formation of a film while keeping favorable developability.

(a-2) Structural Unit Derived from an Unsaturated Compound Containing an Epoxy Group The structural unit (a-2) is derived from an unsaturated monomer containing an epoxy group. Particular examples of the unsaturated monomer containing an epoxy group may include glycidyl (meth)acrylate, 4-hydroxybutyl acrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth) acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, and a combination thereof. Glycidyl (meth)acrylate, 3,4-epoxycyclohexyl (meth)acrylate, 4-hydroxybutyl acrylate glycidyl ether, or a combination thereof is preferable from the viewpoint of storage stability at room temperature and solubility.

The amount of the structural unit derived from an unsaturated compound containing an epoxy group (a-2) may be 1 to 45% by mole, preferably 3 to 30% by mole, based on the total moles of the structural units constituting the acrylic copolymer (A). Within the above range, the storage stability of the composition may be maintained, and the film retention rate upon post-bake may be advantageously enhanced.

(a-3) Structural Unit Derived from an Ethylenically Unsaturated Compound Different from the Structural Units (a-1) and (a-2)

The structural unit (a-3) is derived from an ethylenically unsaturated compound different from the structural units (a-1) and (a-2). The ethylenically unsaturated compound different from the structural units (b-1) and (b-2) may be at least one selected from the group consisting of an ethylenically unsaturated compound having an aromatic ring such as phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tribromophenyl (meth)acrylate, styrene, methylstyrene, dimethylstyrene, trimethylstyrene, ethylstyrene, diethylstyrene, triethylstyrene, propylstyrene, butylstyrene, hexylstyrene, heptylstyrene, octylstyrene, fluorostyrene, chlorostyrene, bromostyrene, iodostyrene, methoxystyrene, ethoxystyrene, propoxystyrene, p-hydroxy-α-methylstyrene, acetylstyrene, vinyl toluene, divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly (ethylene glycol) methyl ether (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, isobornyl (meth)acrylate, dicyclopentanyl (meth)acrylate, dicyclopentenyl (meth) acrylate, dicyclopentanyloxyethyl (meth)acrylate, dicyclopentenyloxyethyl (meth)acrylate, glycidyl (meth)acrylate, 3,4-epoxybutyl (meth)acrylate, 4,5-epoxypentyl (meth)acrylate, 5,6-epoxyhexyl (meth)acrylate, and 6,7-epoxyheptyl (meth)acrylate; an N-vinyl tertiary amine containing an N-vinyl group such as N-vinyl pyrrolidone, N-vinyl carbazole, and N-vinyl morpholine; an unsaturated ether such as vinyl methyl ether and vinyl ethyl ether; and an unsaturated imide such as N-phenylmaleimide, N-(4-chlorophenyl)maleimide, N-(4-hydroxyphenyl)maleimide, and N-cyclohexylmaleimide.

The amount of the structural unit (a-3) may be 5 to 70% by mole, preferably 15 to 65% by mole, based on the total moles of the structural units constituting the acrylic copolymer (A). Within the above amount range, it is possible to control the reactivity of the acrylic copolymer (i.e., an alkali-soluble resin) and to increase the solubility thereof in an aqueous alkaline solution, so that the applicability of the photosensitive resin composition can be remarkably enhanced.

The acrylic copolymer (A) may be prepared by compounding each of the compounds that provide the structural units (a-1), (a-2), and (a-3), and adding thereto a molecular weight controlling agent, a polymerization initiator, a solvent, and the like, followed by charging nitrogen thereto and slowly stirring the mixture for polymerization. The molecular weight controlling agent may be a mercaptan compound such as butyl mercaptan, octyl mercaptan, lauryl mercaptan, or the like, or an α-methylstyrene dimer, but it is not particularly limited thereto.

The polymerization initiator may be an azo compound such as 2,2'-azobisisobutyronitrile, 2,2'-azobis(2,4-dimethylvaleronitrile), and 2,2'-azobis(4-methoxy-2,4-dimethylvaleronitrile); or benzoyl peroxide; lauryl peroxide; t-butyl peroxypivalate; 1,1-bis(t-butylperoxy)cyclohexane, or the like, but it is not limited thereto. The polymerization initiator may be used alone or in combination of two or more thereof.

In addition, the solvent may be any solvent commonly used in the preparation of an acrylic copolymer (A). It may preferably be methyl 3-methoxypropionate or propylene glycol monomethyl ether acetate (PGMEA).

In particular, it is possible to reduce the residual amount of unreacted monomers by keeping the reaction time longer while maintaining the reaction conditions to be milder during the polymerization reaction.

The reaction conditions and the reaction time are not particularly limited. For example, the reaction temperature may be adjusted to a temperature lower than the conventional temperature, for example, from room temperature to 60° C. or from room temperature to 65° C. Then, the reaction time is to be maintained until a sufficient reaction takes place.

It is possible to reduce the residual amount of unreacted monomers in the acrylic copolymer (A) to a very minute level when the acrylic copolymer (A) is prepared by the above process.

Here, the term unreacted monomers (or residual monomers) of the acrylic copolymer (A) as used herein refers to the amount of the compounds (i.e., monomers) that aim to provide the structural units (a-1) to (a-3) of the acrylic copolymer (A), but do not participate in the reaction (i.e., do not form a chain of the copolymer).

Specifically, the amount of unreacted monomers of the acrylic copolymer (A) remaining in the photosensitive resin composition of the present invention may be 2 parts by weight or less, preferably 1 part by weight or less, based on 100 parts by weight of the copolymer (on the basis of solids content).

Here, the term solids content refers to the amount of the composition, exclusive of solvents.

The weight average molecular weight (Mw) of the copolymer thus prepared may be in the range of 500 to 50,000 Da, preferably 3,000 to 30,000 Da, when determined by gel permeation chromatography (eluent: tetrahydrofuran) referenced to a polystyrene standard. Within the above range, the adhesiveness to a substrate is excellent, the physical and chemical properties are good, and the viscosity is proper.

Further, if the acrylic copolymer (A) dissolves too rapidly to a developer during development, there arises a problem that the adhesiveness of a pattern is deteriorated due to the rapid developability of the acrylic resin. If it dissolves too slowly, there is a problem that the sensitivity is lowered.

Therefore, it is important that the acrylic copolymer (A) has an appropriate level of dissolution rate to a developer. Specifically, the acrylic copolymer (A) may have a dissolution rate such that a coated film formed from the photosensitive resin composition at a pre-bake temperature of 100 to 130° C., 100 to 120° C., or 110° C., dissolves in an aqueous solution of 2.38% by weight of tetramethylammonium hydroxide at a rate of 400 to 1,300 Å/sec, 450 to 1,300 Å/sec, 500 to 1,200 Å/sec, or 550 to 1,200 Å/sec. Within the above range, it is more advantageous in terms of the sensitivity and contrast upon development.

The acrylic copolymer (A) may be employed in an amount of 16 to 77% by weight, preferably 20 to 77% by weight, more preferably 20 to 70% by weight, based on the total weight of the photosensitive resin composition on the basis of the solids content, exclusive of solvents. Within the above range, a pattern profile upon development may be favorable, and such properties as film retention rate and chemical resistance may be improved.

(B) Siloxane Copolymer

The photosensitive resin composition of the present invention comprises a siloxane copolymer (B) as a binder in addition to the acrylic copolymer (A).

The siloxane copolymer (i.e., a siloxane polymer or a polysiloxane) includes a condensate of a silane compound and/or a hydrolysate thereof.

In such event, the silane compound or the hydrolysate thereof may be monofunctional to tetrafunctional silane compounds.

As a result, the siloxane copolymer (B) may comprise a siloxane structural unit selected from the following Q, T, D, and M types:

Q type siloxane structural unit: a siloxane structural unit comprising a silicon atom and four adjacent oxygen atoms, which may be derived from, e.g., a tetrafunctional silane compound or a hydrolysate of a silane compound that has four hydrolyzable groups.

T type siloxane structural unit: a siloxane structural unit comprising a silicon atom and three adjacent oxygen atoms, which may be derived from, e.g., a trifunctional silane compound or a hydrolysate of a silane compound that has three hydrolyzable groups.

D type siloxane structural unit: a siloxane structural unit comprising a silicon atom and two adjacent oxygen atoms (i.e., a linear siloxane structural unit), which may be derived from, e.g., a difunctional silane compound or a hydrolysate of a silane compound that has two hydrolyzable groups.

M type siloxane structural unit: a siloxane structural unit comprising a silicon atom and one adjacent oxygen atom, which may be derived from, e.g., a monofunctional silane compound or a hydrolysate of a silane compound that has one hydrolyzable group.

For example, the siloxane copolymer (B) may comprise at least one structural unit derived from a silane compound represented by the following Formula 1, and the siloxane copolymer (B) may be, for example, a condensate of a silane compound represented by the following Formula 1 and/or a hydrolysate thereof.

$$(R^1)_n Si(OR^2)_{4-n}$$ [Formula 1]

In the above Formula 1, n is an integer of 0 to 3, $R^1$ is each independently $C_{1-12}$ alkyl, $C_{2-10}$ alkenyl, $C_{6-15}$ aryl, 3- to 12-membered heteroalkyl, 4- to 10-membered heteroalkenyl, or 6- to 15-membered heteroaryl, and $R^2$ is each independently hydrogen, $C_{1-6}$ alkyl, $C_{2-6}$ acyl, or $C_{6-15}$ aryl, wherein the heteroalkyl, the heteroalkenyl, and the heteroaryl groups each independently have at least one heteroatom selected from the group consisting of O, N, and S.

Examples of the structural unit wherein $R^1$ has a heteroatom include an ether, an ester, and a sulfide.

The compound may be a tetrafunctional silane compound where n is 0, a trifunctional silane compound where n is 1, a difunctional silane compound where n is 2, or a monofunctional silane compound where n is 3.

Particular examples of the silane compound may include, e.g., as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifunctional silane compound, methyltrichlorosilane, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, pentafluorophenyltrimethoxysilane, phenyltrimethoxysilane, phenyltriethoxysilane, $d^3$-methyltrimethoxysilane, nonafluorobutylethyltrimethoxysilane, trifluoromethyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, and 3-trimethoxysilylpropylsuccinic acid; as the difunctional silane compound, dimethyldiacetoxysilane, dimethyldimethoxysilane, diphenyldimethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-chloropropyldimethoxymethylsilane, 3-mercaptopropyldimethoxymethylsilane, cyclohexyldimethoxymethylsilane, diethoxymethylvinylsilane, dimethoxymethylvinylsilane, and dimethoxydi-p-tolylsilane; and as the monofunctional silane compound, trimethylsilane, tributylsilane, trimethylmethoxysilane, tributylethoxysilane, (3-glycidoxypropyl)dimethylmethoxysilane, and (3-glycidoxypropyl)dimethylethoxy silane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, and butyltrimethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane.

These silane compounds may be used alone or in combination of two or more thereof.

The conditions for obtaining a hydrolysate or a condensate of the silane compound of the above Formula 1 are not particularly limited. For example, the silane compound of Formula 1 is optionally diluted with a solvent such as ethanol, 2-propanol, acetone, butyl acetate, or the like, and water that is essential for the reaction and an acid (e.g., hydrochloric acid, acetic acid, nitric acid, or the like) or a base (e.g., ammonia, triethylamine, cyclohexylamine, tetramethylammonium hydroxide, or the like) as a catalyst are added thereto, followed by stirring the mixture to complete the hydrolytic polymerization reaction, whereby the desired hydrolysate or condensate thereof can be obtained.

The weight average molecular weight of the condensate (i.e., siloxane polymer) obtained by the hydrolytic polymerization of the silane compound of the above Formula 1 is preferably in a range of 500 to 50,000 Da. Within the above range, it is more preferable in terms of the film formation characteristics, solubility, dissolution rate to a developer, and the like.

The type and amount of the solvent or the acid or base catalyst used herein may be arbitrarily selected without limitation. The hydrolytic polymerization reaction may be carried out at a low temperature of 20° C. or lower. But the reaction may be expedited by heating or refluxing. The required reaction time varies with the type and concentration of the silane monomers, reaction temperature, and the like. It usually takes 15 minutes to 30 days for the reaction to proceed until the molecular weight of the condensate thus obtained becomes approximately 500 to 50,000 Da. However, the reaction time is not limited to this range.

The siloxane copolymer (B) may comprise a linear siloxane structural unit (i.e., D-type siloxane structural unit). This linear siloxane structural unit may be derived from a difunctional silane compound, for example, a compound represented by the above Formula 1 where n is 2. Particularly, the siloxane copolymer (B) comprises the structural unit derived from the silane compound of the above Formula 1 where n is 2 in an amount of 0.5 to 50% by mole, preferably 1 to 30% by mole, based on an Si atomic mole number. Within the above content range, it is possible that a cured film may have flexible characteristics while maintaining a certain level of hardness, whereby the crack resistance to an external stress can be further enhanced.

Further, the siloxane copolymer (B) may comprise a structural unit derived from a silane compound represented by the above Formula 1 where n is 1 (i.e., T-type structural unit). Preferably, the siloxane copolymer (B) comprises the structural unit derived from the silane compound of the above Formula 1 where n is 1 in an amount ratio of 40 to 85% by mole, more preferably 50 to 80% by mole, based on an Si atomic mole number. Within the above content range, it is more advantageous to form a precise pattern profile.

In addition, in consideration of the hardness, sensitivity, and retention rate of a cured film, it is preferable that the siloxane copolymer (B) comprises a structural unit derived from a silane compound having an aryl group. For example, the siloxane copolymer (B) may comprise a structural unit derived from a silane compound having an aryl group in an amount of 30 to 70% by mole, preferably 35 to 50% by mole, based on an Si atomic mole number. Within the above content range, the compatibility of the siloxane copolymer (B) with a 1,2-naphthoquinonediazide compound is good, which may prevent an excessive decrease in sensitivity while attaining more favorable transparency of a cured film. The structural unit derived from the silane compound having an aryl group may be a structural unit derived from a silane compound of the above Formula 1 where $R^3$ is an aryl group, preferably a silane compound of the above Formula 1 where n is 1 and $R^3$ is an aryl group, particularly a silane compound of the above Formula 1 where n is 1 and $R^3$ is a phenyl group (i.e., siloxane structural unit of T-phenyl type).

The siloxane copolymer (B) may comprise a structural unit derived from a silane compound represented by the above Formula 1 where n is 0 (i.e., Q-type structural unit). Preferably, the siloxane copolymer (B) may comprise the structural unit derived from the silane compound represented by the above Formula 1 where n is 0 in an amount of 10 to 40% by mole, preferably 15 to 35% by mole, based on an Si atomic mole number. Within the above content range, the photosensitive resin composition may maintain its solubility to an aqueous alkaline solution at a proper level during the formation of a pattern, thereby preventing any defects caused by a reduction in the solubility or a drastic increase in the solubility of the composition.

The term "% by mole based on an Si atomic molar number" as used herein refers to a percentage of the number of moles of Si atoms contained in a specific structural unit with respect to the total number of moles of Si atoms contained in all of the structural units constituting the siloxane polymer.

The molar amount of a siloxane unit in the siloxane copolymer (B) may be measured by the combination of Si-NMR, $^1$H-NMR, $^{13}$C-NMR, IR, TOF-MS, elementary analysis, measurement of ash, and the like. For example, in order to measure the molar amount of a siloxane unit having a phenyl group, an Si-NMR analysis is performed on the entire siloxane polymer, followed by an analysis of the phenyl-bound Si peak area and the phenyl-unbound Si peak area. The molar amount can then be computed from the peak area ratio between them.

The photosensitive resin composition of the present invention may comprise the siloxane copolymer (B) in an amount of 16 to 77% by weight, preferably 20 to 77% by weight, more preferably 20 to 70% by weight, based on the total weight of the composition on the basis of the solids content excluding solvents.

Further, the siloxane copolymer (B) may be employed in an amount of 5 to 150 parts by weight, preferably 5 to 120 parts by weight, more preferably 5 to 100 parts by weight, based on 100 parts by weight of the acrylic copolymer (A) (on the basis of the solids content). Within the above content ranges, it is possible to maintain the developability at a suitable level, thereby producing a cured film that is excellent in the film retention rate and the pattern contrast.

(C) Compound Containing a Phenolic Hydroxyl Group

The photosensitive resin composition of the present invention comprises a compound containing a phenolic hydroxyl group (C).

The compound containing a phenolic hydroxyl group (C) contains a phenolic group in the structure thereof. It lowers the dissolution rate of an unexposed region to a developer by increasing the binding force with a compound that is activated by light (e.g., 1,2-quinonediazide-based compound (D)). On the other hand, it further increases the dissolution rate of a region exposed to an ultraviolet ray, to thereby maintain a high contrast and good adhesiveness characteristics.

Specifically, the compound containing a phenolic hydroxyl group (C) can be easily dissolved in a developer. However, the compound containing a phenolic hydroxyl group (C) may be hydrogen-bonded to the photoactive compound in the unexposed region (without an ultraviolet ray), which may lower the dissolution rate of the composition to a developer. On the other hand, the compound containing a phenolic hydroxyl group (C) may not be hydrogen-bonded to the photoactive compound in the exposed region (with an ultraviolet ray), and those already hydrogen-bonded may be decomposed by light. Since the compound containing a phenolic hydroxyl group (C) may maintain its inherent dissolution rate, the solubility of the composition to a developer can be increased.

That is, the adhesive force may be further improved by hydrogen bonding in an unexposed region, while an appropriate dissolution rate may be attained in an exposed region, thereby producing an excellent contrast.

The compound containing a phenolic hydroxyl group (C) may be a trisphenol-type compound such as tris(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, and bis(5-cyclohexyl-4-hydroxy-2-methylphenyl)-3,4-dihydroxyphenylmethane; a linear type polyphenolic compound, e.g., a linear type 3-nucleus phenolic compound such as bis(2,3,4-trihydroxyphenyl)methane, bis(2,4-dihydroxyphenyl)methane, 2,3,4-trihydroxyphenyl-4'-hydroxyphenylmethane, 2,4-bis(3,5-dimethyl-4-hydroxybenzyl)-5-hydroxyphenol, and 2,6-bis(2,5-dimethyl-4-hydroxybenzyl)-4-methylphenol; a linear type 4-nucleus phenolic compound such as 1,1-bis[3-(2-hydroxy-5-methylbenzyl)-4-hydroxy-5-cyclohexylphenyl]isopropane, bis[2,5-dimethyl-3-(4-hydroxy-5-methylbenzyl)-4-hydroxyphenyl]methane, bis[2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-5- methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, and bis[2,5-dimethyl-3-(2-hydroxy-5-methylbenzyl)-4-hydroxyphenyl]methane; and a linear type 5-nucleus phenolic compound such as 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and 2,6-bis[2,5-dimethyl-3-(2-hydroxy-5-methylbenzyl)-4-hydroxybenzyl]-4-methylphenol; a bisphenol-type compound such as 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, and 2-(2,3,4-trihydroxyphenyl)-2-(4'-hydroxy-3',5'-dimethylphenyl)propane; a polynuclear branched compound such as 1-[1,1-bis(4-methylphenyl)ethyl]-4-[1-(4-hydroxyphenyl)isopropyl]benzene, 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene; a condensed phenolic compound such as 1,1-bis(4-hydroxyphenyl)cyclohexane;

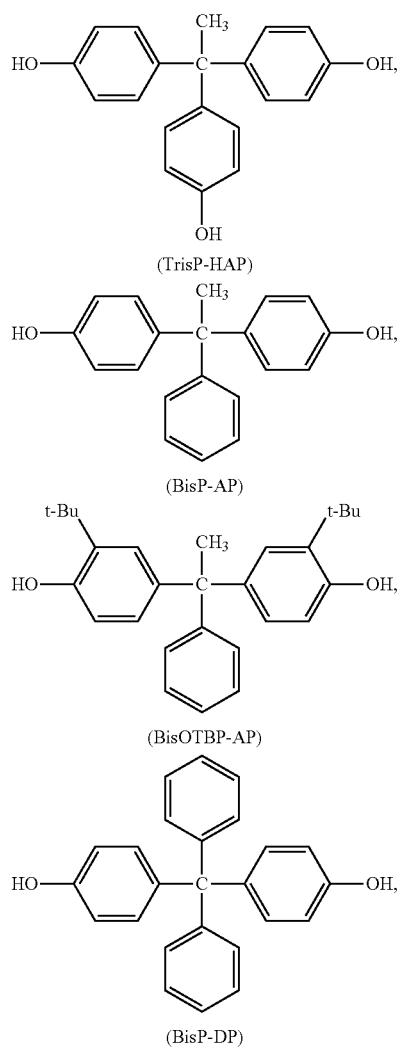

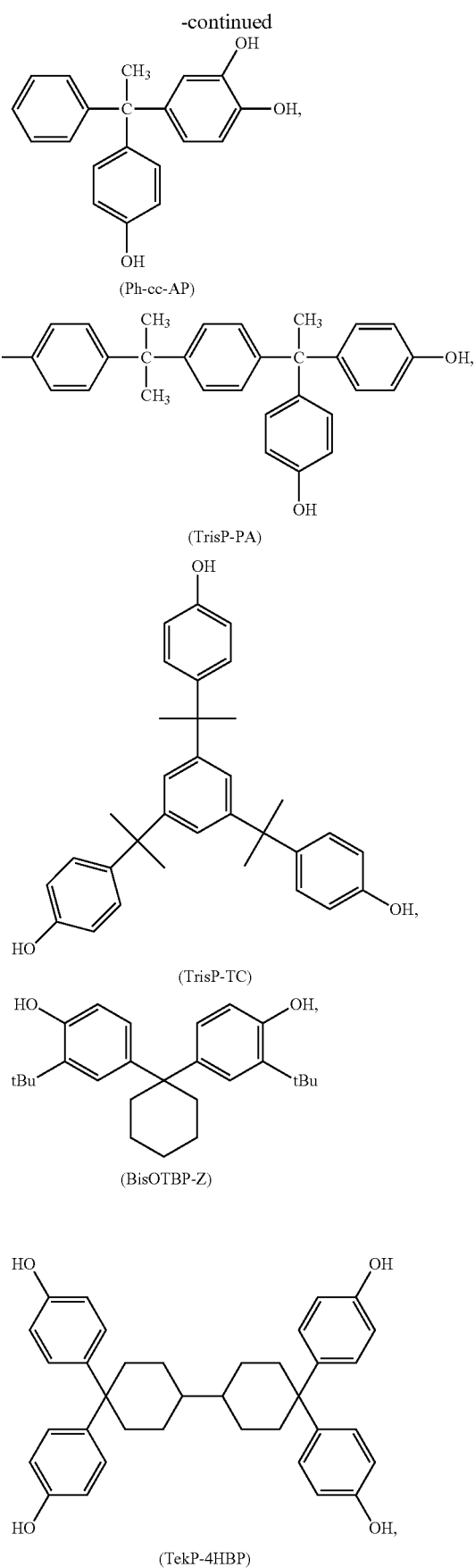

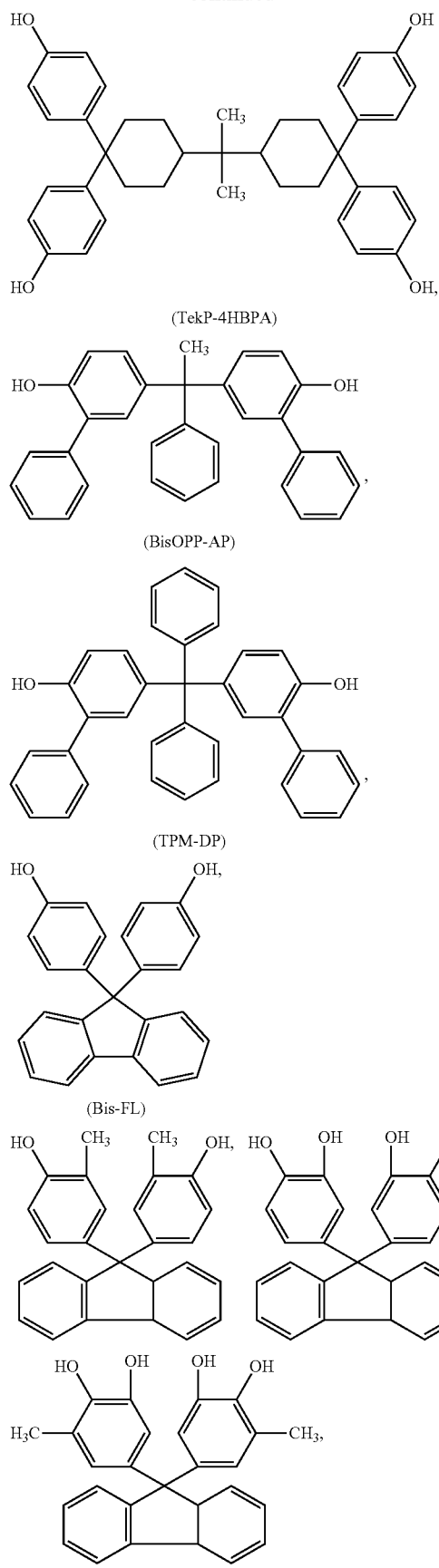

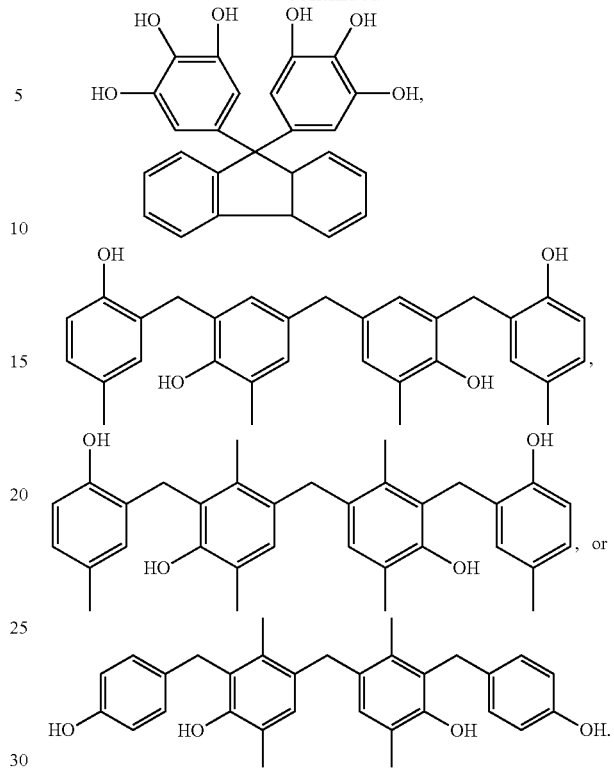

Specifically, the compound containing a phenolic hydroxyl group (C) may preferably be a trisphenol-type compound such as bis(5-cyclohexyl-4-hydroxy-2-methylphenyl)-3,4-dihydroxyphenylmethane, bis(4-hydroxy-2,3,5-trimethylphenyl)-2-hydroxyphenylmethane, and the like, a linear type 4-nucleus phenolic compound such as 1,1-bis[3-(2-hydroxy-5-methylbenzyl)-4-hydroxy-5-cyclohexylphenyl]isopropane,

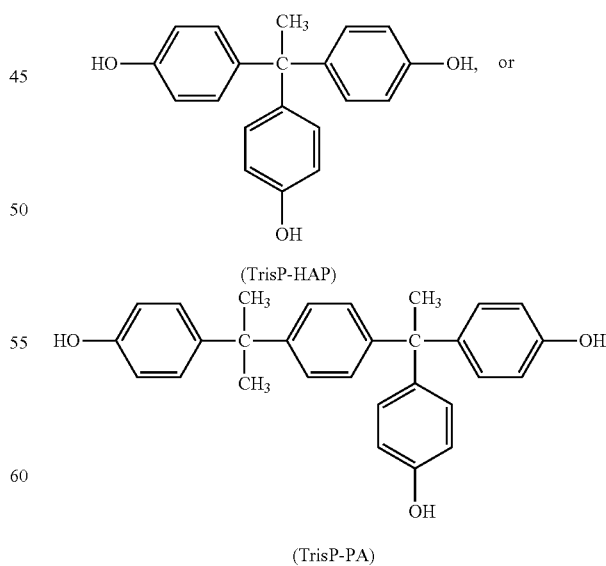

from the viewpoint of the pattern formation and developability at the time of development.

The compound containing a phenolic hydroxyl group (C) may be employed in an amount of 1 to 50 parts by weight, preferably 2 to 40 parts by weight, more preferably 2 to 30 parts by weight, based on 100 parts by weight of the acrylic copolymer (on the basis of the solids content). Within the above range, it is possible to attain pattern characteristics with a high sensitivity and an excellent adhesiveness in a half-tone region.

(D) 1,2-Quinonediazide-Based Compound

The photosensitive resin composition of the present invention comprises a 1,2-quinonediazide-based compound (D).

The 1,2-quinonediazide-based compound (D) is a photoactive compound that is activated by light (e.g., an ultraviolet ray). It may control the solubility of the composition to a developer together with the compound containing a phenolic hydroxyl group (C) as described above.

The 1,2-quinonediazide-based compound may be a compound used as a photosensitive agent in the photoresist field.

Examples of the 1,2-quinonediazide-based compound include an ester of a phenolic compound and 1,2-benzoquinonediazide-4-sulfonic acid or 1,2-benzoquinonediazide-5-sulfonic acid; an ester of a phenolic compound and 1,2-naphthoquinonediazide-4-sulfonic acid or 1,2-naphthoquinonediazide-5-sulfonic acid; a sulfonamide of a phenolic compound in which the hydroxyl group is substituted with an amino group and 1,2-benzoquinonediazide-4-sulfonic acid or 1,2-benzoquinonediazide-5-sulfonic acid; a sulfonamide of a phenolic compound in which the hydroxyl group is substituted with an amino group and 1,2-naphthoquinonediazide-4-sulfonic acid or 1,2-naphthoquinonediazide-5-sulfonic acid. The above compounds may be used alone or in combination of two or more thereof.

Examples of the phenolic compound include 2,3,4-trihydroxybenzophenone, 2,4,6-trihydroxybenzophenone, 2,2',4,4'-tetrahydroxybenzophenone, 2,3,3',4-tetrahydroxybenzophenone, 2,3,4,4'-tetrahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, 3,3,3',3'-tetramethyl-1,1'-spirobiindene-5,6,7,5',6',7'-hexanol, 2,2,4-trimethyl-7,2',4'-trihydroxyflavane, and the like.

More particular examples of the 1,2-quinonediazide-based compound include an ester of 2,3,4-trihydroxybenzophenone and 1,2-naphthoquinonediazide-4-sulfonic acid, an ester of 2,3,4-trihydroxybenzophenone and 1,2-naphthoquinonediazide-5-sulfonic acid, an ester of 4,4'-[1-[4-[1-[4-hydroxyphenyl]-1-methylethyl]phenyl]ethylidene]bisphenol and 1,2-naphthoquinonediazide-4-sulfonic acid, an ester of 4,4'-[1-[4-[1-[4-hydroxyphenyl]-1-methylethyl]phenyl]ethylidene]bisphenol and 1,2-naphthoquinonediazide-5-sulfonic acid, and the like.

The above compounds may be used alone or in combination of two or more thereof.

If the preferable compounds exemplified above are used, the transparency of the photosensitive resin composition may be enhanced.

The 1,2-quinonediazide-based compound (D) may be employed in an amount of 10 to 35 parts by weight, preferably 12 to 35 parts by weight, more preferably 12 to 32 parts by weight, based on 100 parts by weight of the acrylic copolymer (A) (on the basis of the solids content).

Within the above content range, a pattern is more readily formed, and it is possible to suppress such defects as a rough surface of a coated film upon the formation thereof and such a pattern shape as scum appearing at the bottom portion of the pattern upon development.

(E) Epoxy Compound

In the positive-type photosensitive resin composition according to the present invention, an epoxy compound may additionally be employed together with the siloxane copolymer (B) so as to increase the internal density of a siloxane binder (i.e., siloxane copolymer), to thereby improve the chemical resistance of a cured film to be prepared therefrom.

The epoxy compound (E) may be a homo-oligomer or a hetero-oligomer of an unsaturated monomer containing at least one epoxy group.

Examples of the unsaturated monomer containing at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, and a mixture thereof. Preferably, glycidyl methacrylate may be used.

The epoxy compound may be synthesized by any methods well known in the art.

An example of the commercially available epoxy compound may be GHP03 (glycidyl methacrylate homopolymer, Miwon Commercial Co., Ltd.).

The epoxy compound (E) may further comprise the following structural unit.

Particular examples thereof may include any structural unit derived from styrene; a styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; a styrene having a halogen such as fluorostyrene, chlorostyrene, bromostyrene, and iodostyrene; a styrene having an alkoxy substituent such as methoxystyrene, ethoxystyrene, and propoxystyrene; p-hydroxy-α-methylstyrene, acetylstyrene; an ethylenically unsaturated compound having an aromatic ring such as divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine having an N-vinyl group such as N-vinyl pyrrolidone, N-vinyl carbazole, and N-vinyl morpholine; an unsaturated ether such as vinyl methyl ether and vinyl ethyl ether; an unsaturated imide such as N-phenylmaleimide, N-(4-chlorophenyl)maleimide, N-(4-hydroxyphenyl)maleimide, and N-cyclohexylmaleimide. The structural unit derived from the compounds exemplified above may be contained in the epoxy compound (E) alone or in combination of two or more thereof.

The styrene-based compounds among the above compounds may be preferable in consideration of polymerizability.

In particular, it is more preferable in terms of the chemical resistance that the epoxy compound (E) does not contain a carboxyl group by way of not using a structural unit derived from a monomer containing a carboxyl group among the above.

The structural unit may be contained in an amount of 0 to 70% by mole, preferably 10 to 60% by mole, based on the total molar amount of the structural units constituting the epoxy compound (E). Within the above content range, it may be more advantageous in terms of the film strength.

The weight average molecular weight of the epoxy compound (E) may preferably be 100 to 30,000 Da. The weight average molecular weight thereof may more preferably be 1,000 to 15,000 Da. If the weight average molecular weight of the epoxy compound is at least 100 Da, the hardness of a cured film may be more favorable. If it is 30,000 Da or less, a cured film may have a uniform thickness, which is suitable for planarizing any steps thereon.

In the positive-type photosensitive resin composition of the present invention, the epoxy compound (E) may be employed in an amount of 0 to 20 parts by weight, preferably 0 to 17 parts by weight, more preferably 0 to 15 parts by weight, based on 100 parts by weight of the acrylic copolymer (A) (on the basis of the solids content). Within the above content range, the chemical resistance and sensitivity of the photosensitive resin composition may be more favorable.

(F) Silane Compound

The positive-type photosensitive resin composition of the present invention may comprise at least one silane compound represented by the above Formula 1. In particular, it may comprise silane monomers of T type and/or Q type, to thereby enhance the chemical resistance during the treatment in the post-processing by reducing highly reactive silanol groups (Si—OH) in the siloxane copolymer, in association with the epoxy compound, for instance epoxy oligomers.

  [Formula 1]

The definition of the above Formula 1 is the same as described above.

Examples of the structural unit wherein $R^1$ has a heteroatom include an ether, an ester, and a sulfide.

The compound may be a tetrafunctional silane compound where n is 0, a trifunctional silane compound where n is 1, a difunctional silane compound where n is 2, or a monofunctional silane compound where n is 3.

Particular examples of the silane compound may include, e.g., as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifunctional silane compound, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, phenyltrimethoxysilane, phenyltriethoxysilane, $d^3$-methyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, and 3-trimethoxysilylpropylsuccinic acid; as the difunctional silane compound, dimethyldiacetoxysilane, dimethyldimethoxysilane, diphenyldimethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-mercaptopropyldimethoxymethylsilane, cyclohexyldimethoxymethylsilane, diethoxymethylvinylsilane, dimethoxymethylvinylsilane, and dimethoxydi-p-tolylsilane; and as the monofunctional silane compound, trimethylsilane, tributylsilane, trimethylmethoxysilane, tributylethoxysilane, (3-glycidoxypropyl)dimethylmethoxysilane, and (3-glycidoxypropyl)dimethylethoxysilane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, butyltrimethoxysilane, 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane.

These silane compounds may be used alone or in combination of two or more thereof.

The silane compound (F) may be employed in an amount of 0 to 20 parts by weight, preferably 0 to 15 parts by weight, more preferably 0 to 12 parts by weight, based on 100 parts by weight of the acrylic copolymer (A) (on the basis of the solids content). Within the above content range, the chemical resistance of a cured film may be further enhanced.

(G) Solvent

The positive-type photosensitive resin composition of the present invention may be prepared in the form of a liquid composition in which the above components are mixed with a solvent. The solvent may be, for example, an organic solvent.

The amount of the solvent in the positive-type photosensitive resin composition according to the present invention is not particularly limited. For example, the solvent may be employed such that the solids content is 10 to 70% by weight, preferably 15 to 60% by weight, based on the total weight of the composition.

The term solids content refers to the components that constitute the composition, exclusive of solvents. If the amount of the solvent is within the above range, the coating of the composition can be readily carried out, and the flowability thereof can be maintained at a proper level.

The solvent of the present invention is not particularly limited as long as it can dissolve the above-mentioned components and is chemically stable. For example, the solvent may be alcohols, ethers, glycol ethers, ethylene glycol alkyl ether acetates, diethylene glycol, propylene glycol monoalkyl ethers, propylene glycol alkyl ether acetates, propylene glycol alkyl ether propionates, aromatic hydrocarbons, ketones, esters, or the like.

Particular examples of the solvent include methanol, ethanol, tetrahydrofuran, dioxane, methyl cellosolve acetate, ethyl cellosolve acetate, ethyl acetoacetate, ethylene glycol monomethyl ether, ethylene glycol monoethyl ether, ethylene glycol dimethyl ether, ethylene glycol diethyl ether, propylene glycol dimethyl ether, propylene glycol diethyl ether, diethylene glycol monomethyl ether, diethylene glycol monoethyl ether, diethylene glycol dimethyl ether, diethylene glycol ethyl methyl ether, propylene glycol monomethyl ether, propylene glycol monoethyl ether, propylene glycol monopropyl ether, dipropylene glycol dimethyl ether, dipropylene glycol diethyl ether, propylene glycol methyl ether acetate, propylene glycol ethyl ether acetate, propylene glycol propyl ether acetate, dipropylene glycol methyl ether acetate, propylene glycol butyl ether acetate, toluene, xylene, methyl ethyl ketone, 4-hydroxy-4-methyl-2-pentanone, cyclopentanone, cyclohexanone, 2-heptanone, γ-butyrolactone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 2-methoxypropionate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methylpyrrolidone, and the like.

Preferred among the above are ethylene glycol alkyl ether acetates, diethylene glycols, propylene glycol monoalkyl ethers, propylene glycol alkyl ether acetates, ketones and the like. In particular, preferred are diethylene glycol dimethyl ether, diethylene glycol ethyl methyl ether, dipropylene glycol dimethyl ether, dipropylene glycol diethyl ether, propylene glycol monomethyl ether, propylene glycol monoethyl ether, propylene glycol methyl ether acetate, methyl 2-methoxypropionate, γ-butyrolactone, 4-hydroxy-4-methyl-2-pentanone, and the like.

The solvents exemplified above may be used alone or in combination of two or more thereof.

(H) Surfactant

The positive-type photosensitive resin composition of the present invention may further comprise a surfactant to enhance its coatability, if desired.

The kind of the surfactant is not limited. Examples thereof may include fluorine-based surfactants, silicon-based surfactants, non-ionic surfactants, and the like.

Specific examples of the surfactant (H) may include fluorine- and silicon-based surfactants such as FZ-2122 supplied by Dow Corning Toray Co., Ltd., BM-1000 and BM-1100 supplied by BM CHEMIE Co., Ltd., Megapack F-142 D, F-172, F-173, and F-183 supplied by Dai Nippon Ink Chemical Kogyo Co., Ltd., Florad FC-135, FC-170 C, FC-430, and FC-431 supplied by Sumitomo 3M Ltd., Sufron S-112, S-113, S-131, S-141, S-145, S-382, SC-101, SC-102, SC-103, SC-104, SC-105, and SC-106 supplied by Asahi Glass Co., Ltd., Eftop EF301, EF303, and EF352 supplied by Shinakida Kasei Co., Ltd., SH-28 PA, SH-190, SH-193, SZ-6032, SF-8428, DC-57, and DC-190 supplied by Toray Silicon Co., Ltd.; non-ionic surfactants such as polyoxyethylene alkyl ethers including polyoxyethylene lauryl ether, polyoxyethylene stearyl ether, polyoxyethylene oleyl ether, and the like; polyoxyethylene aryl ethers including polyoxyethylene octylphenyl ether, polyoxyethylene nonylphenyl ether, and the like; and polyoxyethylene dialkyl esters including polyoxyethylene dilaurate, polyoxyethylene distearate, and the like; and organosiloxane polymer KP341 (manufactured by Shin-Etsu Chemical Co., Ltd.), (meth) acrylate-based copolymer Polyflow Nos. 57 and 95 (manufactured by Kyoei Yuji Chemical Co., Ltd.), and the like. They may be used alone or in combination of two or more thereof.

The surfactant (H) may be employed in the photosensitive resin composition in an amount of 0.001 to 5 parts by weight, preferably 0.001 to 3 parts by weight, more preferably 0.001 to 2 parts by weight, based on 100 parts by weight of the acrylic copolymer (A) (on the basis of the solids content). Within the above content range, the coating of the composition is smoothly carried out.

(I) Adhesion Supplement

The photosensitive resin composition of the present invention may further comprise an adhesion supplement to enhance the adhesiveness to a substrate.

The adhesion supplement may have at least one reactive group selected from the group consisting of a carboxyl group, a (meth)acryloyl group, an isocyanate group, an amino group, a mercapto group, a vinyl group, and an epoxy group.

The kind of the adhesion supplement is not particularly limited. It may be at least one selected from the group consisting of trimethoxysilyl benzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane, γ-glycidoxypropyltriethoxysilane, N-phenylaminopropyltrimethoxysilane, and β-(3,4-epoxycyclohexyl)ethyltrimethoxysilane. Preferred is γ-glycidoxypropyltrimethoxysilane, γ-glycidoxypropyltriethoxysilane, or N-phenylaminopropyltrimethoxysilane, which is capable of enhancing the film retention rate and is excellent in the adhesiveness to a substrate.

The adhesion supplement (I) may be employed in an amount of 0.001 to 5 parts by weight, preferably 0.001 to 3 parts by weight, more preferably 0.001 to 2 parts by weight, based on 100 parts by weight of the acrylic copolymer (A) (on the basis of the solids content). Within the above content range, the adhesiveness to a substrate may be further enhanced.

In addition, the photosensitive resin composition of the present invention may further comprise other additives as long as the physical properties of the photosensitive resin composition are not adversely affected.

The photosensitive resin composition according to the present invention may be used as a positive-type photosensitive resin composition.

In particular, the positive-type photosensitive resin composition of the present invention comprises an acrylic copolymer having a dissolution rate to a developer in a specific range and a compound containing a phenolic hydroxyl group, so that it is possible to attain a high contrast and a high sensitivity pattern when a cured film is formed.

Figure 2:
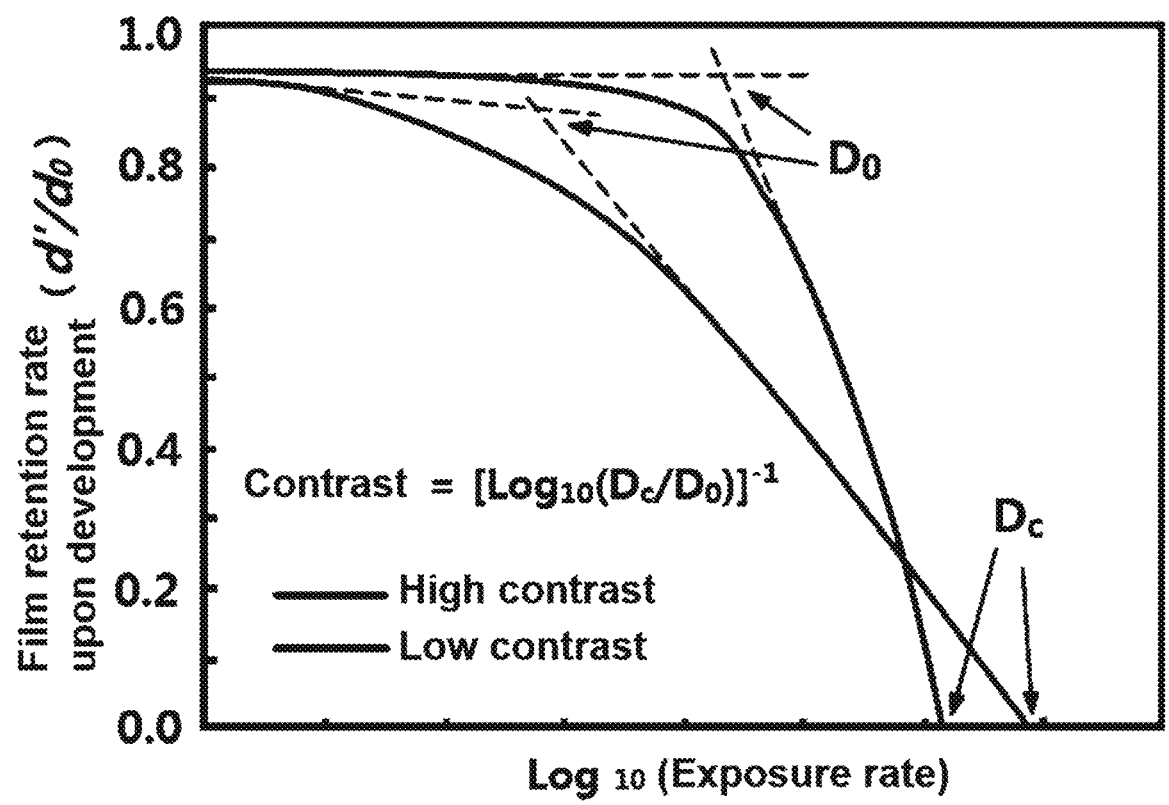
FIG. 2 is a graph obtained by averaging the film retention rates (or contrast) in the Examples and Comparative Examples obtained in Evaluation Example 4.

Specifically, when the photosensitive resin composition according to the present invention is coated onto a glass substrate and cured to form a dried film. The dried film was developed, exposed to light at an exposure rate of 200 mJ/cm² based on a wavelength of 365 nm, and heated to prepare a cured film having a thickness of 3 μm. Then, the contrast (γ) value of the cured film according to the following Equation 1 may be 4.5 to 6.0, 4.5 to 5.7, or 4.5 to 5.5 (see Evaluation Example 4 and FIG. 2).

$$\text{Contrast}(\gamma) = [\text{Log}_{10}(D_c/D_0)]^{-1} \quad \text{[Equation 1]}$$

$D_c = \text{Log}_{10}$ (the energy when the film thickness is 0 upon development)

$D_0 = \text{Log}_{10}$ [the intersection of the film retention rate ($d'/d_0$) upon development and the straight-line slope of a contrast graph]

$d_0$ = (initial) film thickness before development $d'$ = film thickness upon development Further, it is possible to further enhance the adhesiveness of a pattern to a substrate a half-tone, as well as a full-tone, is formed, if the photosensitive resin composition according to the present invention is used.

The present invention provides a cured film formed from the photosensitive resin composition.

The cured film may be formed by a method known in the art, for example, a method in which the photosensitive resin composition is coated on a substrate and then cured.

More specifically, in the curing step, the photosensitive resin composition coated on a substrate may be subjected to pre-bake at a temperature of, for example, 60 to 130° C. to remove solvents; then exposed to light using a photomask having a desired pattern; and subjected to development using a developer, for example, a tetramethylammonium hydroxide (TMAH) solution to form a pattern on the coating layer. Thereafter, the patterned coating layer, if necessary, is subjected to post-bake, for example, at a temperature of 150 to 300° C. for 10 minutes to 5 hours to prepare a desired cured film. The exposure to light may be carried out at an exposure rate of 10 to 200 mJ/cm² based on a wavelength of 365 nm in a wavelength band of 200 to 500 nm. According to the process of the present invention, it is possible to easily form a desired pattern from the viewpoint of the process.

The coating of the photosensitive resin composition onto a substrate may be carried out by a spin coating method, a slit coating method, a roll coating method, a screen printing method, an applicator method, or the like, in a desired thickness of, e.g., 2 to 25 μm. In addition, as a light source used for the exposure (irradiation), a low-pressure mercury lamp, a high-pressure mercury lamp, an extra high-pressure mercury lamp, a metal halide lamp, an argon gas laser, or the like may be used. X-ray, electronic ray, or the like may also be used, if desired.

The photosensitive resin composition of the present invention is capable of forming a cured film that is excellent in terms of the heat resistance, transparency, dielectric constant, solvent resistance, acid resistance, and alkali resistance. Therefore, the cured film of the present invention thus formed has excellent light transmittance devoid of surface roughness when it is subjected to heat treatment or is immersed in, or comes into contact with a solvent, an acid, a base, or the like. Thus, the cured film can be effectively used as a planarization film for a thin-film transistor (TFT) substrate of a liquid crystal display or an organic EL display; a partition of an organic EL display; an interlayer dielectric of a semiconductor device; a core or cladding material of an optical waveguide, or the like. Further, the present invention provides an electronic part that comprises the cured film as a protective film.

Hereinafter, the present invention will be described in more detail with reference to the following examples. However, these examples are provided to illustrate the present invention, and the scope of the present invention is not limited thereto only.

In the following synthesis examples, the weight average molecular weight is determined by gel permeation chromatography (GPC, eluent: tetrahydrofuran) referenced to a polystyrene standard.

Synthesis Example 1: Synthesis of an Acrylic Copolymer (A-1)

A flask equipped with a cooling tube and a stirrer was charged with 200 parts by weight of propylene glycol monomethyl ether acetate as a solvent, and the temperature of the solvent was raised to 70° C. while the solvent was stirred slowly. Added thereto were 15.9 parts by weight of methacrylic acid, 20.8 parts by weight of glycidyl methacrylate, 20.3 parts by weight of styrene, 31.2 parts by weight of methyl methacrylate, and 11.7 parts by weight of methacrylate, followed by dropwise adding of 3 parts by weight of 2,2'-azobis(2,4-dimethylvaleronitrile) as a radical polymerization initiator over 5 hours to carry out a polymerization reaction. The weight average molecular weight of the copolymer thus obtained (solids content: 30% by weight) was 10,000 Da.

Synthesis Example 2: Synthesis of an Acrylic Copolymer (A-2)

Polymerization was carried out in the same manner as in Synthesis Example 1, except that 17.7 parts by weight of methacrylic acid, 20.4 parts by weight of styrene, 29.4 parts by weight of methyl methacrylate, and 11.8 parts by weight of methacrylate were used. The weight average molecular weight of the copolymer thus obtained (solids content: 30% by weight) was 10,000 Da.

Synthesis Example 3: Synthesis of a Siloxane Copolymer (B)

A reactor equipped with a reflux condenser was charged with 53.5 parts by weight of phenyltrimethoxysilane, 18.4 parts by weight of methyltrimethoxysilane, 28.1 parts by weight of tetraethoxysilane, 20% by weight of pure water, and 5% by weight of PGMEA, followed by refluxing and vigorously stirring the mixture for 7 hours in the presence of 0.1% by weight of an oxalic acid catalyst. Then, the mixture was cooled and diluted with PGMEA such that the solids content was 40%. As a result, a polymer having a weight average molecular weight of 5,000 to 10,000 Da as analyzed by GPC referenced to polystyrene was synthesized.

Examples and Comparative Examples: Preparation of Photosensitive Resin Compositions The photosensitive resin compositions of the following Examples and Comparative Examples were prepared using the compounds prepared in the above Synthesis Examples.

The components used in the following Examples and Comparative Examples are as follows.

TABLE 1

| | | Component | Solids content (wt. %) | Supplier |
|---|---|---|---|---|
| A | Acrylic copolymer | Synthesis Ex. 1 and 2 (A-1 and A-2) | 30 | — |
| B | Siloxane copolymer | Synthesis Ex. 3 | 40 | — |
| C | Compound containing a phenolic hydroxyl group | C-1  4,4'-(1-(4-(2-(4-hydroxyphenyl)propane-2-yl)ethane-1,1-diyl)diphenol (TrisP-PA) | 100 | Miwon |
| | | C-2  1,1,1-tris(4-hydroxyphenyl)ethane (TrisP-HAP) | 100 | Miwon |
| D | 1,2-quinonediazid compound | TPA-523 | 100 | Miwon |
| G | Solvent | Propylene glycol monomethyl ether acetate (PGMEA) | — | Chemtronix |
| H | Surfactant | Silicon-based leveling surfactant, FZ-2122 | 100 | Dow Corning Toray |

Example 1

23.85 g of the acrylic copolymer (A-1) synthesized in Synthesis Example 1, 23.85 g of the acrylic copolymer (A-2) synthesized in Synthesis Example 2, 15.33 g of the siloxane copolymer (B) synthesized in Synthesis Example 3, 1.25 g of the compound containing a phenolic hydroxyl group (C-1), 3.25 g of the 1,2-quinonediazide compound (D), 0.06 g of the surfactant (H), and 32.42 g of the solvent were homogeneously mixed. The mixture solution was stirred for 3 hours and filtered through a membrane filter having a pore size of 0.2 m to obtain a composition solution having a solids content of 25% by weight.

Examples 2 to 6 and Comparative Examples 1 to 5

Photosensitive resin compositions were each prepared in the same manner as in Example 1, except that the kinds and/or contents of the respective components were changed as shown in Table 2 below.

TABLE 2

| Comp. (g) | Acrylic copolymer (A) | | Siloxane copolymer | Compound containing a phenolic hydroxyl group (C) | | 1,2-quinonediazid | Solvent | Surfactant |
|---|---|---|---|---|---|---|---|---|
| | A-1 | A-2 | (B) | C-1 | C-2 | compound | (G) | (H) |
| Ex. 1 | 23.85 | 23.85 | 15.33 | 1.25 | — | 3.25 | 32.42 | 0.06 |
| Ex. 2 | 22.39 | 23.39 | 14.39 | 2.50 | — | 3.25 | 35.02 | 0.06 |
| Ex. 3 | 20.93 | 20.93 | 13.46 | 3.75 | — | 3.25 | 37.63 | 0.06 |
| Ex. 4 | 23.85 | 23.85 | 15.33 | — | 1.25 | 3.25 | 32.42 | 0.06 |
| Ex. 5 | 35.77 | 11.92 | 15.33 | 1.25 | — | 3.25 | 32.42 | 0.06 |
| Ex. 6 | 11.92 | 35.77 | 15.33 | 1.25 | — | 3.25 | 32.42 | 0.06 |
| C. Ex. 1 | 25.31 | 25.31 | 16.26 | — | — | 3.25 | 29.81 | 0.06 |
| C. Ex. 2 | 12.65 | 37.96 | 16.26 | — | — | 3.25 | 29.81 | 0.06 |
| C. Ex. 3 | — | 50.61 | 16.26 | — | — | 3.25 | 29.81 | 0.06 |
| C. Ex. 4 | — | 47.69 | 15.33 | 1.25 | — | 3.25 | 32.41 | 0.06 |
| C. Ex. 5 | 47.69 | — | 15.33 | 1.25 | — | 3.25 | 32.42 | 0.06 |

Evaluation Example 1: Evaluation of the Dissolution Rate (ADR) of an Acrylic Copolymer (A)

In order to determine the dissolution rate of the acrylic copolymers used in the above Examples and Comparative Examples, the acrylic copolymer was spin-coated on a wafer substrate and pre-baked on a hot plate maintained at 110° C. for 120 seconds to form a dry film with a thickness of 1 μm. The coating film formed in a thickness of 1 μm on the wafer substrate was measured for the dissolution rate (Å/sec) in an aqueous solution of 2.38% by weight of tetramethylammonium hydroxide under the same conditions as the development using a dissolution rate meter (Luzchem, model: TFA-11CT). The results are shown in Table 3 below.

Evaluation Example 2: Evaluation of Sensitivity

The compositions prepared in the Examples and the Comparative Examples were each coated onto a glass substrate by spin coating. The coated substrate was then pre-baked on a hot plate kept at 115° C. for 120 seconds to form a dry film. The dried film was exposed, through a mask having a pattern of square holes in a size ranging from 1 μm to 30 μm, to light at an exposure rate of 0 to 200 mJ/cm$^2$ based on a wavelength of 365 nm for a certain time period using an aligner (model name: MA6) that emits light having a wavelength of 200 nm to 450 nm, in which the gap between the mask and the substrate was 25 μm. It was then developed for 60 seconds with a developer, which was an aqueous solution of 2.38% by weight of tetramethylammonium hydroxide, through puddle nozzles at 23° C. The developed film was then exposed to light at an exposure rate of 200 mJ/cm$^2$ based on a wavelength of 365 nm for a certain time period using an aligner (model name: MA6) that emits light having a wavelength of 200 nm to 450 nm (i.e., bleaching step). The exposed film was heated in a convection oven at 230° C. for 30 minutes to prepare a cured film having a thickness of 3 μm. For the hole pattern formed per a size of the mask of 10 μm in the above procedure, the amount of exposure energy for attaining a critical dimension (CD, line width, unit: μm) of 10 μm was measured. The lower the value (mJ/cm²), the better the sensitivity. The results are shown in Table 3 below.

Evaluation Example 3: Evaluation of Adhesiveness for a Half-Tone

The compositions prepared in the Examples and the Comparative Examples were each coated onto a glass substrate by spin coating. The coated substrate was then pre-baked on a hot plate kept at 115° C. for 120 seconds to form a dry film. A photomask having each pattern of 6 lines ranging from 1 μm to 30 μm at an interval of 1 μm was applied to the dry film, which was then exposed to light at an exposure rate of 0 to 200 mJ/cm² based on a wavelength of 365 nm for a certain time period using an aligner (model name: MA6) that emits light having a wavelength of 200 nm to 450 nm (i.e., bleaching step), in which the gap between the mask and the substrate was 25 μm. In such event, a certain amount of transmittance (i.e., transmittance to form a thickness of 1.5 μm) was applied to the bulk regions other than the line regions in the photomask, to thereby form a half-tone in the bulk regions. It was then developed with an aqueous developer of 2.38% by weight of tetramethylammonium hydroxide through puddle nozzles at 23° C. for 60 seconds. The developed film was then exposed to light at an exposure rate of 200 mJ/cm² based on a wavelength of 365 nm for a certain time period using an aligner (model name: MA6) that emits light having a wavelength of 200 nm to 450 nm (i.e., bleaching step). The exposed film was heated in a convection oven at 230° C. for 30 minutes to prepare a cured film having a thickness of 1.5 μm (referenced to 3 m in the non-exposure regions). Then, the extent of the smallest line pattern remaining in the 1 μm to 30 μm line patterns on a silicon nitride substrate was observed using a microscope. During the microscopic observation, the pattern of the lowest CD size remaining after the line patterns had been detached with the mask CD was evaluated as the development adhesiveness. The smaller the minimum residual pattern size, the better the development adhesiveness. Specifically, the adhesiveness was evaluated in accordance with the minimum residual pattern size, as follows. The results are shown in Table 3 below and FIG. 1.

If the minimum residual pattern size was 2 m or smaller, it was marked as ⊙. If it was greater than 2 μm to 3 μm, it was marked as ○. If it was greater than 3 μm to 8 μm, it was marked as Δ. If it was greater than 8 μm, it was marked as x.

Evaluation Example 4: Evaluation of Contrast (γ)

The compositions prepared in the Examples and the Comparative Examples were each coated onto a glass substrate by spin coating. The coated substrate was then pre-baked on a hot plate kept at 115° C. for 120 seconds to form a dry film. A mask split in various transmittances at a certain interval was applied to the dry film, which was then exposed to light at an exposure rate of 0 to 200 mJ/cm² based on a wavelength of 365 nm for a certain time period using an aligner (model name: MA6) that emits light having a wavelength of 200 nm to 450 nm, in which the gap between the mask and the substrate was 25 μm. It was then developed with an aqueous developer of 2.38% by weight of tetramethylammonium hydroxide through puddle nozzles at 23° C. for 60 seconds. It was then exposed to light at an exposure rate of 200 mJ/cm² based on a wavelength of 365 nm for a certain time period using an aligner (model name: MA6) that emits light having a wavelength of 200 nm to 450 nm (i.e., bleaching step). The exposed film was heated in a convection oven at 2301 for 30 minutes to prepare a cured film having a thickness of 3 μm. The changes in the thickness of the cured film formed by the above process with respect to the exposure energy were measured by a thickness measurement equipment (SNU Precision) to obtain a contrast value from d' (film thickness upon development) and $d_0$ (initial film thickness before development). The larger the value, the better the contrast. The results are shown in Table 3 below and FIG. 2.

$$\text{Contrast}(\gamma) = [\text{Log}_{10}(D_c/D_0)]^{-1}$$

$D_c$=$\text{Log}_{10}$ (the energy when the film thickness is 0 upon development)
$D_0$=$\text{Log}_{10}$[the intersection of the film retention rate (d'/$d_0$) upon development and the straight-line slope of a contrast graph]
d'=film thickness upon development
$d_0$=(initial) film thickness before development If the value was 4 or less, it was marked as x. If it was greater than 4 to 5, it was marked as ○. If it was greater than 5, it was marked as ⊙.

Evaluation Example 5: Evaluation of Film Retention Rate

The compositions prepared in the Examples and the Comparative Examples were each coated onto a glass substrate by spin coating. The coated substrate was then pre-baked on a hot plate kept at 115° C. for 120 seconds to form a dry film. It was then developed with an aqueous developer of 2.38% by weight of tetramethylammonium hydroxide through puddle nozzles at 23° C. for 60 seconds. The developed film was then exposed to light at an exposure rate of 200 mJ/cm² based on a wavelength of 365 nm for a certain time period using an aligner (model name: MA6) that emits light having a wavelength of 200 nm to 450 nm (i.e., bleaching step). The exposed film was heated in a convection oven at 230° C. for 30 minutes to prepare a cured film having a thickness of 3 μm. The film retention rate (%) was obtained from the following Equation 1 by calculating the ratio in a percent of the thickness of the film after the post-bake to that of the film after the pre-bake by using a measuring instrument (SNU Precision). The higher the numerical value, the better the film retention rate. Specifically, if the film retention rate was 70% or higher, it was evaluated as excellent. The results are shown in Table 3 below.

Film retention rate (%)=(film thickness after post-bake/film thickness after pre-bake)×100  [Equation 1]

If the value was less than 70%, it was marked as x. If it was 70% or more, it was marked as ○.

TABLE 3

| | Results | | | | |
|---|---|---|---|---|---|
| | ADR (Å/sec) | Sensitivity (mJ) | Half-tone adhesiveness | Contrast (γ) | Film retention rate (%) |
| Ex. 1 | 831 | 70 | ○ | 5.03 ⊙ | 86.2 ○ |
| Ex. 2 | 831 | 60 | ⊙ | 5.07 ⊙ | 85.9 ○ |

TABLE 3-continued

| | | | Results | | | | |
|---|---|---|---|---|---|---|---|
| | ADR (Å/sec) | Sensi- tivity (mJ) | Half-tone adhesive- ness | | Contrast (γ) | | Film retention rate (%) | |
| Ex. 3 | 831 | 50 | ⊙ | | 5.31 | ⊙ | 84.9 | ○ |
| Ex. 4 | 831 | 60 | ○ | | 5.25 | ⊙ | 85.7 | ○ |
| Ex. 5 | 580 | 95 | ○ | | 4.53 | ○ | 91.0 | ○ |
| Ex. 6 | 1083 | 50 | ○ | | 5.19 | ⊙ | 80.8 | ○ |
| C. Ex. 1 | 831 | 85 | X | | 4.58 | ○ | 87.3 | ○ |
| C. Ex. 2 | 1083 | 55 | X | | 4.45 | ○ | 76.3 | ○ |
| C. Ex. 3 | 1335 | 40 | X | | 3.85 | X | 68.5 | X |
| C. Ex. 4 | 1335 | 35 | Δ | | 5.21 | ⊙ | 68.4 | X |
| C. Ex. 5 | 328 | 150 | ⊙ | | 3.96 | X | 91.8 | ○ |

As shown in Table 3 above, the acrylic copolymers used in Examples 1 to 6 each had a dissolution rate of 400 to 1,300 Å/sec under the development conditions. In contrast, the dissolution rates of the acrylic copolymers used in Comparative Examples 3 to 5 were less than or more than the above range.

Further, the compositions of Examples 1 to 6, which comprised the compound containing a phenolic hydroxyl group and the acrylic copolymer together, were excellent in sensitivity, contrast, and film retention rate.

In addition, as confirmed from the results of Table 3 and the photograph of FIG. 1, the pattern on the substrate was well maintained even after the post-processing such as bleaching after the formation of a half-tone, which indicates that the adhesiveness of the compositions of the Examples was excellent.

In contrast, the compositions of Comparative Examples 1 to 3 (which did not comprise the compound containing a phenolic hydroxyl group) showed almost no pattern that remained as a result of the evaluation of the half-tone adhesiveness.

In addition, the composition of Comparative Example 4, which comprised an acrylic copolymer having a dissolution rate outside the scope of the present invention with the compound containing a phenolic hydroxyl group, had a pattern that remained on the substrate upon the formation of a half-tone. But the results showed that the number of remaining patterns and sharpness were inferior to those of the Examples. The composition of Comparative Example 5 was good in the half-tone adhesiveness, but the contrast thereof was poor.

The invention claimed is:

1. A positive-type photosensitive resin composition, which comprises:
   (A) an acrylic copolymer;
   (B) a siloxane copolymer;
   (C) a compound containing a phenolic hydroxyl group;
   (D) 1,2-quinonediazide compound; and
   (E) an epoxy compound,
   wherein the epoxy compound (E) is a homo oligomer of an unsaturated monomer including at least one epoxy group.

2. The positive-type photosensitive resin composition of claim 1,
   wherein the acrylic copolymer (A) has a dissolution rate of 400 to 1,300 Å/sec when it dissolves in an aqueous solution of 2.38% by weight of tetramethylammonium hydroxide at 110° C. for 90 seconds.

3. The positive-type photosensitive resin composition of claim 2, wherein the acrylic copolymer (A) has a weight average molecular weight (Mw) of 500 to 50,000 Da.

4. The positive-type photosensitive resin composition of claim 1,
   wherein the siloxane copolymer (B) comprises a structural unit derived from a silane compound represented by the following Formula 1:

$(R^1)_n Si(OR^2)_{4-n}$ [Formula 1]

in the above Formula 1,
   n is an integer of 0 to 3;
   $R^1$ is each independently $C_{1-12}$ alkyl, $C_{2-10}$ alkenyl, $C_{6-15}$ aryl, 3- to 12-membered heteroalkyl, 4- to 10-membered heteroalkenyl, or 6- to 15-membered heteroaryl; and
   $R^2$ is each independently hydrogen, $C_{1-6}$ alkyl, $C_{2-6}$ acyl, or $C_{6-15}$ aryl,
   wherein the heteroalkyl, the heteroalkenyl, and the heteroaryl groups each independently have at least one heteroatom selected from the group consisting of O, N, and S.

5. The positive-type photosensitive resin composition of claim 4,
   wherein the siloxane copolymer (B) comprises a structural unit derived from a silane compound represented by the above Formula 1 where n is 0.

6. The positive-type photosensitive resin composition of claim 1,
   wherein the acrylic copolymer (A) comprises (a-1) a structural unit derived from an ethylenically unsaturated carboxylic acid, an ethylenically unsaturated carboxylic anhydride, or a combination thereof; (a-2) a structural unit derived from an unsaturated compound containing an epoxy group; and (a-3) a structural unit derived from an ethylenically unsaturated compound different from the structural units (a-1) and (a-2).

7. The positive-type photosensitive resin composition of claim 1,
   which comprises the compound containing a phenolic hydroxyl group (C) in an amount of 1 to 50 parts by weight based on 100 parts by weight of the acrylic copolymer (A) on the basis of the solids content.

8. The positive-type photosensitive resin composition of claim 1,
   wherein the siloxane copolymer (B) is employed in an amount of 5 to 60% by weight based on the total weight of the acrylic copolymer (A) and the siloxane copolymer (B) on the basis of the solids content.

9. The positive-type photosensitive resin composition of claim 1,
   which further comprises at least one silane compound represented by the following Formula 1:

$(R^1)_n Si(OR^2)_{4-n}$ [Formula 1]

in the above Formula 1,
   n is an integer of 0 to 3;
   $R^1$ is each independently $C_{1-12}$ alkyl, $C_{2-10}$ alkenyl, $C_{6-15}$ aryl, 3- to 12-membered heteroalkyl, 4- to 10-membered heteroalkenyl, or 6- to 15-membered heteroaryl; and
   $R^2$ is each independently hydrogen, $C_{1-6}$ alkyl, $C_{2-6}$ acyl, or $C_{6-15}$ aryl,
   wherein the heteroalkyl, the heteroalkenyl, and the heteroaryl groups each independently have at least one heteroatom selected from the group consisting of O, N, and S.

10. The positive-type photosensitive resin composition of claim 1,
   wherein when the photosensitive resin composition is coated onto a glass substrate and cured to form a dried film and the dried film is developed, exposed to light at an exposure rate of 200 mJ/cm² based on a wavelength of 365 nm, and heated to prepare a cured film having a thickness of 3 μm, the contrast (γ) value of the cured film according to the following Equation 1 is 4.5 to 6.0:

$$\mathrm{Contrast}(\gamma)=[\mathrm{Log}_{10}(D_c/D_0)]^{-1} \quad \text{[Equation 1]}$$

$D_c=\mathrm{Log}_{10}$ (the energy when the film thickness is 0 upon development)

$D_0=\mathrm{Log}_{10}$ [the intersection of the film retention rate (d'/d$_0$) upon development and the straight-line slope of a contrast graph]

$d_0$=(initial) film thickness before development d'=film thickness upon development.

11. A cured film prepared from the positive-type photosensitive resin composition of claim 1.

* * * * *